United States Patent
Nammi et al.

(10) Patent No.: US 10,014,890 B2
(45) Date of Patent: Jul. 3, 2018

(54) PREPARING TRANSMISSION SIGNALS FOR TRANSMISSION

(71) Applicant: Telefonaktiebolaget LM Ericsson (publ), Stockholm (SE)

(72) Inventors: Sairamesh Nammi, Austin, TX (US); Thomas Chapman, Solna (SE); Torbjörn Elfström, Fjärås (SE); Bo Göransson, Sollentuna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/557,313

(22) PCT Filed: Mar. 25, 2015

(86) PCT No.: PCT/SE2015/050359
§ 371 (c)(1),
(2) Date: Sep. 11, 2017

(87) PCT Pub. No.: WO2016/153404
PCT Pub. Date: Sep. 29, 2016

(65) Prior Publication Data
US 2018/0054224 A1   Feb. 22, 2018

(51) Int. Cl.
| | | |
|---|---|---|
| *H04B 1/04* | (2006.01) | |
| *H04B 7/0426* | (2017.01) | |
| *H04L 25/03* | (2006.01) | |
| *H04B 7/06* | (2006.01) | |
| *H04L 1/00* | (2006.01) | |

(52) U.S. Cl.
CPC .......... *H04B 1/0475* (2013.01); *H04B 7/0426* (2013.01); *H04B 7/0697* (2013.01); *H04L 1/0001* (2013.01); *H04L 25/03343* (2013.01)

(58) Field of Classification Search
CPC .. H04B 1/0475; H04B 7/0426; H04B 7/0697; H04B 7/0413; H04B 1/0458; H04B 1/7075; H04B 1/709
See application file for complete search history.

(56) References Cited

U.S. PATENT DOCUMENTS

| | | |
|---|---|---|
| 9,408,095 B2 | 8/2016 | Lightstone et al. |
| 2014/0269966 A1* | 9/2014 | Faccin ............... H04B 7/0413 |
| | | 375/267 |

FOREIGN PATENT DOCUMENTS

WO    2015150874 A1    10/2015

* cited by examiner

*Primary Examiner* — Kabir A Timory
(74) *Attorney, Agent, or Firm* — Sage Patent Group (57) ABSTRACT

It is presented a method for determining how to prepare transmission signals for transmission. The method is performed in a transmitter device and comprises the steps of: obtaining an indicator of mutual correlation between signals transmitted from different transmission antennas of the transmitter device; when the indicator indicates mutual correlation less than a threshold value, selecting a first transmission signal operation scheme; and when the indicator indicates a mutual correlation greater than the threshold value, selecting a second transmission signal operation scheme.

16 Claims, 4 Drawing Sheets

PREPARING TRANSMISSION SIGNALS FOR TRANSMISSION

TECHNICAL FIELD

The invention relates to a method, transmitter device, computer program and computer program product for preparing transmission signals for transmission.

BACKGROUND

In cellular communication systems, multiple input multiple output (MIMO) systems are increasing in popularity. MIMO systems employ several antennas both at the transmitter and receiver side to increase transfer capacity over a transmission medium. However, due to simultaneous use of several antennas on the transmitter side, there is also crosstalk between transmitter antennas. The crosstalk may reduce performance of the transmitter.

In S. A. Bassam et al 'Crossover Digital Predistorter for the compensation of Crosstalk and Nonlinearity in MIMO transmitter', IEEE Trans. On Microwave Theory and Techniques, Vol. 57, No. 5, May 2009, it is proposed crossover digital predistorter model to compensate for crosstalk and nonlinearity in MIMO radio systems. However, the proposed model is complex and requires significant resources to employ.

SUMMARY

It is an object to provide a way to reduce the effect of mutual coupling between transmitters in an efficient way.

According to a first aspect, it is presented a method for determining how to prepare transmission signals for transmission. The method is performed in a transmitter device and comprises the steps of: obtaining an indicator of mutual correlation between signals transmitted from different transmission antennas of the transmitter device; when the indicator indicates mutual correlation less than a threshold value, selecting a first transmission signal operation scheme; and when the indicator indicates a mutual correlation greater than the threshold value, selecting a second transmission signal operation scheme.

The first transmission signal operation scheme may be a first DPD, Digital Predistortion, procedure which determines DPD coefficients based on mutual coupling between transmission antennas of the transmitter device; and the second transmission signal operation scheme may be a second DPD procedure which determines DPD coefficients without consideration to the mutual coupling between the transmission antennas of the transmitter device.

The method may further comprise the step of: applying DPD in accordance with the selected DPD procedure.

The first transmission signal operation scheme may be a power back off for a power amplifier of the transmission device compared to the second transmission signal operation scheme.

The method may further comprise the step of: applying the selected power back off in the power amplifier.

The indicator may be a rank for a current transmission channel, the rank indicating a number of independent transmission layers in spatial multiplexing.

The indicator may be a correlation metric of transmission symbols of different transmission branches of the transmitter device.

The method may be repeated for each transmission symbol of the transmitter device.

According to a second aspect, it is presented a transmitter device for determining how to prepare transmission signals for transmission. The transmitter device comprises: a processor; and a memory storing instructions that, when executed by the processor, causes the transmitter device to: obtain an indicator of mutual correlation between signals transmitted from different transmission antennas of the transmitter device; when the indicator indicates mutual correlation less than a threshold value, select a first transmission signal operation scheme; and when the indicator indicates a mutual correlation greater than the threshold value, select a second transmission signal operation scheme.

The first transmission signal PA operation scheme may be a first DPD, Digital Predistortion, procedure which determines DPD coefficients based on mutual coupling between transmission antennas of the transmitter device; and the second PA transmission signal operation scheme may be a second DPD procedure which determines DPD coefficients without consideration to the mutual coupling between the transmission antennas of the transmitter device.

The transmitter device may further comprise instructions that, when executed by the processor, causes the transmitter device to apply DPD in accordance with the selected DPD procedure.

The first transmission signal operation scheme is a power back off for a power amplifier of the transmission device compared to the second transmission signal.

The transmitter device may further comprise instructions that, when executed by the processor, causes the transmitter device to: apply the selected power back off in the power amplifier.

The indicator may be a rank for a current transmission channel, the rank indicating a number of independent transmission layers in spatial multiplexing.

The indicator may be correlation metric of transmission symbols of different transmission branches of the transmitter device.

The transmitter device may further comprise instructions that, when executed by the processor, causes the transmitter device to repeated the mentioned instructions for each transmission symbol of the transmitter device.

The transmitter device may be a radio base station.

The transmitter device may be a mobile terminal.

According to a third aspect, it is presented a transmitter device comprising: means for obtaining an indicator of mutual correlation between signals transmitted from different transmission antennas of the transmitter device; means for selecting a first transmission signal operation scheme when the indicator indicates mutual correlation less than a threshold value; and means for selecting a second transmission signal operation scheme when the indicator indicates a mutual correlation greater than the threshold value.

According to a fourth aspect, it is presented a computer program for determining how to prepare transmission signals for transmission. The computer program comprises computer program code which, when run on a transmitter device causes the transmitter device to: obtain an indicator of mutual correlation between signals transmitted from different transmission antennas of the transmitter device; when the indicator indicates mutual correlation less than a threshold value, select a first transmission signal operation scheme; and when the indicator indicates a mutual correlation greater than the threshold value, select a second transmission signal operation scheme.

According to a fifth aspect, it is presented a computer program product comprising a computer program according to the fourth aspect and a computer readable means on which the computer program is stored.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
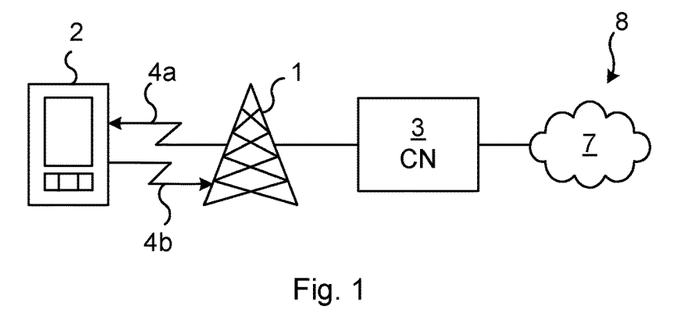
FIG. 1 is a schematic diagram illustrating a cellular communication network where embodiments presented herein may be applied.

FIG. 1 is a schematic diagram illustrating a cellular communication network 8 where embodiments presented herein may be applied. The cellular communication network 8 comprises a core network 3 and one or more radio network nodes 1, here in the form of radio base stations being evolved Node Bs, also known as eNode Bs or eNBs. The radio network node 1 could also be in the form of Node Bs, BTSs (Base Transceiver Stations) and/or BSSs (Base Station Subsystems), etc. The radio network node 1 provides radio connectivity over a wireless interface 4a-b to a plurality of wireless terminals 2. The term wireless terminal is also known as mobile communication terminal, user equipment (UE), mobile terminal, user terminal, user agent, wireless device, machine-to-machine device etc., and can be, for example, what today are commonly known as a mobile phone, smart phone or a tablet/laptop with wireless connectivity. The term wireless is here to be construed as having the ability to perform wireless communication. More specifically, the wireless terminal 2 can comprise a number of wires for internal and/or external purposes.

The cellular communication network 8 may e.g. comply with any one or a combination of LTE (Long Term Evolution), W-CDMA (Wideband Code Division Multiplex), EDGE (Enhanced Data Rates for GSM (Global System for Mobile communication) Evolution), GPRS (General Packet Radio Service), CDMA2000 (Code Division Multiple Access 2000), or any other current or future wireless network, such as LTE-Advanced, as long as the principles described hereinafter are applicable.

Over the wireless interface, downlink (DL) communication 4a occurs from the radio network node 1 to the wireless terminal 2 and uplink (UL) communication 4b occurs from the wireless terminal 2 to the radio network node 1. The quality of the wireless radio interface 4a-b for each wireless terminal 2 can vary over time and depending on the position of the wireless terminal 2, due to effects such as fading, multipath propagation, interference, etc.

The radio network node 1 is also connected to the core network 3 for connectivity to central functions and a wide area network 7, such as the Internet.

Figure 2:
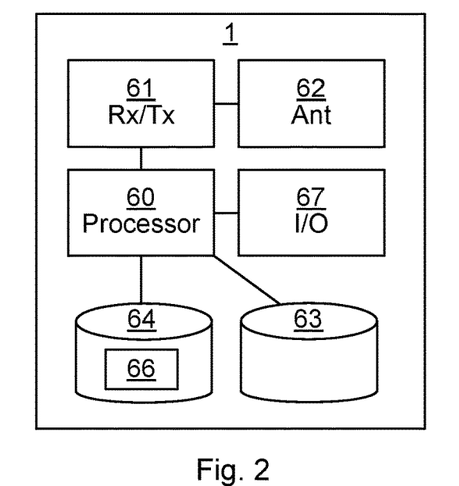
FIG. 2 is a schematic diagram showing some components of the radio network node of FIG. 1.

FIG. 2 is a schematic diagram showing some components of the radio network node 1 of FIG. 1. A processor 60 is provided using any combination of one or more of a suitable central processing unit (CPU), multiprocessor, microcontroller, digital signal processor (DSP), application specific integrated circuit etc., capable of executing software instructions 66 stored in a memory 64, which can thus be a computer program product. The processor 60 can be configured to execute the method described with reference to FIGS. 6A-B below.

The memory 64 can be any combination of read and write memory (RAM) and read only memory (ROM). The memory 64 also comprises persistent storage, which, for example, can be any single one or combination of magnetic memory, optical memory, solid state memory or even remotely mounted memory.

A data memory 63 is also provided for reading and/or storing data during execution of software instructions in the processor 60. The data memory 63 can be any combination of read and write memory (RAM) and read only memory (ROM).

The radio network node 1 further comprises an I/O interface 67 for communicating with other external entities. Optionally, the I/O interface 67 also includes a user interface.

The radio network node 1 also comprises a transmitter device 61, which may optionally also be used for reception in a combined transceiver. The transmitter device 61 is connected to a suitable number of antennas 62 for wireless communication with wireless terminals as shown in FIG. 1.

Other components of the radio network node 1 are omitted here in order not to obscure the concepts presented herein.

Figure 3:
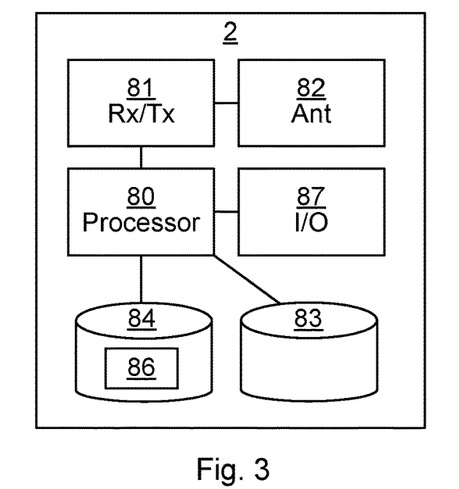
FIG. 3 is a schematic diagram showing some components of the wireless terminal of FIG. 1.

FIG. 3 is a schematic diagram showing some components of the wireless terminal 2 of FIG. 1. A processor 80 is provided using any combination of one or more of a suitable central processing unit (CPU), multiprocessor, microcontroller, digital signal processor (DSP), application specific integrated circuit etc., capable of executing software instructions 86 stored in a memory 84, which can thus be a computer program product. The processor 80 can be configured to execute the method described with reference to FIGS. 6A-B below.

The memory 84 can be any combination of read and write memory (RAM) and read only memory (ROM). The memory 84 also comprises persistent storage, which, for example, can be any single one or combination of magnetic memory, optical memory, solid state memory or even remotely mounted memory.

A data memory 83 is also provided for reading and/or storing data during execution of software instructions in the processor 80. The data memory 83 can be any combination of read and write memory (RAM) and read only memory (ROM).

The wireless terminal 2 further comprises an I/O interface 87 for communicating with other external entities. The I/O interface 87 also includes a user interface, such as a touch sensitive display, buttons, speaker, microphone, etc.

The wireless terminal 2 also comprises a transmitter device 81, which may optionally also be used for reception in a combined transceiver. The transmitter device 81 is connected to a suitable number of antennas 82 for wireless communication with radio network nodes as shown in FIG. 1.

Other components of the wireless terminal 2 are omitted here in order not to obscure the concepts presented herein.

It is to be noted that for embodiments presented herein, these relate to transmissions from a transmitter device which can be either form part of the radio network node 1 or the wireless terminal 2.

Figure 4:
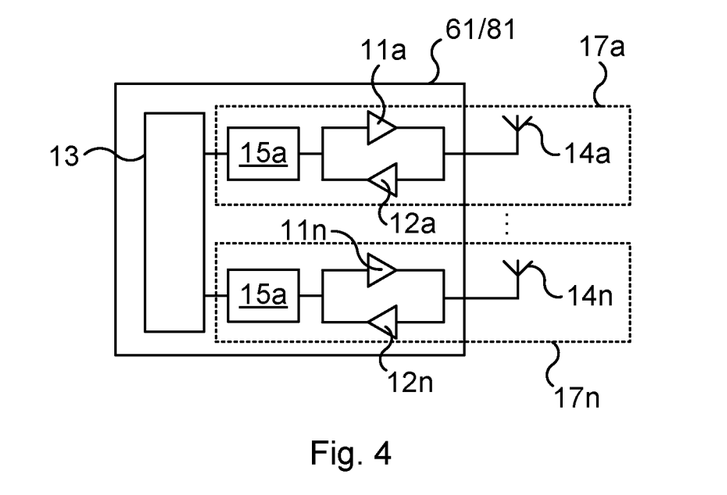
FIG. 4 is a schematic diagram illustrating a transmitter device which can form part of either of the radio network node or the wireless terminal as described above with reference to FIGS. 2-3.

FIG. 4 is a schematic diagram illustrating a transmitter device 61, 81 which can form part of either of the radio network node 1 or the wireless terminal 2 as described above with reference to FIGS. 2-3.

Looking first from a transmission perspective, a baseband device 13 is responsible for digital baseband processing in the baseband. Digital transmission signals are then provided to n antenna branches 17a-n. Each antenna branch 17a-n comprises, respectively, a digital predistortion (DPD) device 15a-n, and a power amplifier 11a-n which is used for transmission over a connected antenna 14a-n. Each one of the antennas 14a-n can consist of one or more antenna elements. For reception, signals are received using the respective antennas 14a-n and is amplified using the respective reception amplifiers 12a-n. Note that each antenna branch 17a-n comprises additional elements not shown here, such as digital to analogue (D/A) converters, analogue to digital (A/D) converters, oscillators, up/down converters, etc.

Optionally, each antenna branch 17a-n forms part of an active array antenna system (AAS), where each antenna branch 17a-n forms a separate physical device. Such active antennas can be used in many applications, e.g. cell specific beamforming, user specific beamforming, vertical sectorization, massive MIMO (Multiple Input Multiple Output), elevation beamforming etc.

In many cases, the power amplifier 11a-n needs to be operated in a non-linear region for achieving good efficiency. However, when the power amplifier 11a-n operates in the non-linear region, other frequency components are created (e.g. harmonics and intermodulation products) which fall outside the allocated frequency range. One way to compensate for the non-linearity of the power amplifier is to distort the input signal to the power amplifier such that the output signal from the power amplifier is transformed to be close to what it would have been if the power amplifier would have been linear. This is the principle of DPD, which is then performed by the DPD devices 15a-n.

In a MIMO system using AAS, in addition to the nonlinear power amplifier, signals from adjacent antenna elements will be leaked or coupled (through element mutual coupling) and corrupt the desired signal. This phenomenon can be denoted mutual coupling, crosstalk or antenna port-to-port isolation. Mutual coupling can be characterised by the individual port-to-port isolation of an array antenna. In effect, the leaked signal appears as a reverse intermodulation signal at the transceiver output. In particular, if the signals transmitted from the transceivers are uncorrelated (as is likely to be the case to some degree in a MIMO system), then the reverse intermodulation can cause disturbances to the operation of control algorithms such as DPD. If, however, the transceivers are transmitting fully correlated signals, then the impact to DPD is not severe.

It can be noted that if the transmission rank is the same as the number of antenna branches, the signals are in general uncorrelated. Rank can be defined as the number of independent transmission layers in spatial multiplexing. On the other hand, if a low rank signal is transmitted over many antenna branches, the signals are in more correlated. For MIMO systems, when the transmission rank is one, the signals from the transceivers are perfectly correlated. If the rank is greater than one, the signals are to some extent uncorrelated. Also, if transmission diversity is applied, then the signals are uncorrelated. It can also be noted that the impact due to crosstalk increased with decreasing distance between the antenna elements.

Figure 5:
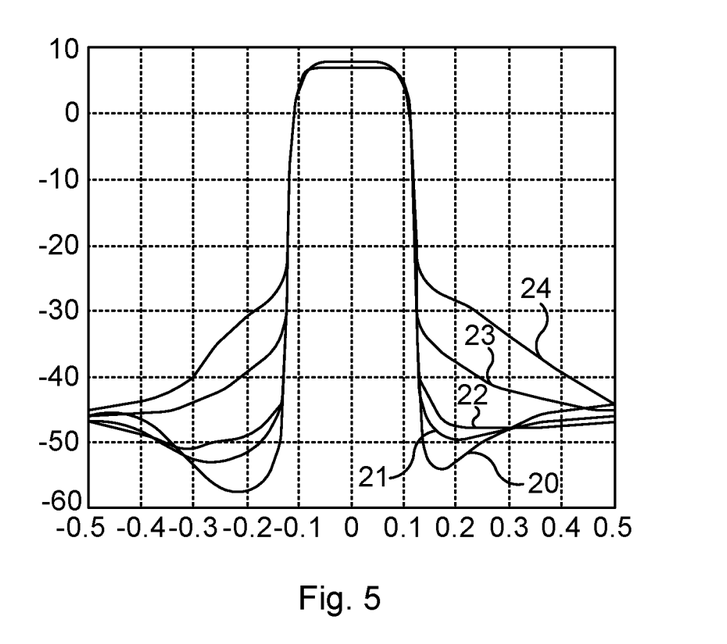
FIG. 5 is a schematic graph illustrating power spectral density (in dB) in the transmitter device of FIG. 4.

Looking now also to FIG. 5, this is a schematic graph illustrating power spectral density (in dB) on the vertical axis against normalised frequency ($f/f_s$) on the horizontal axis.

A first line 20 relates to the case where there is no mutual coupling and DPD is employed. A second line 21 relates to the case where the distance between antenna elements is $1.0*\lambda$ (wavelength of the signal). A third line 22 relates to the case where the distance between antenna elements is $0.75*\lambda$. A fourth line 23 relates to the case where the distance between antenna elements is $0.35*\lambda$. A fifth line 24 relates to the case when no DPD is employed.

It can be seen that as the mutual coupling value increases (distance between the elements decreases), more energy is leaked to surrounding frequencies, i.e. the spectrum moves away from the ideal, due to the operation of the DPD being disturbed.

It should be noted that transceivers driving different radiating elements may experience different levels of coupling. Thus, spectral regrowth effects may be more severe for some transceivers than for others.

As described above, Bassam et al proposes to mitigate the negative impact due to mutual coupling, by employing a crossover digital pre distortion technique, which takes into consideration mutual coupling in the DPD formulation.

We can thus group DPD usage into two types, conventional DPD and mutual coupling DPD.

In conventional DPD, mutual coupling effects are not taken into consideration when formulating the DPD coefficients.

In mutual coupling DPD, the mutual coupling and associated reverse intermodulation signals are taken into consideration when formulating the DPD coefficients. This type also encompasses when the mutual coupling is estimated and cancelled before passing to the DPD.

The inventors have realised that by selectively employing mutual coupling DPD, essentially the same effect is achieved as when employing mutual coupling DPD all the time, but with much less computational cost.

Specifically, the mutual coupling DPD is only used when mutual correlation between transmission antennas are greater than a threshold value.

Figure 6A:
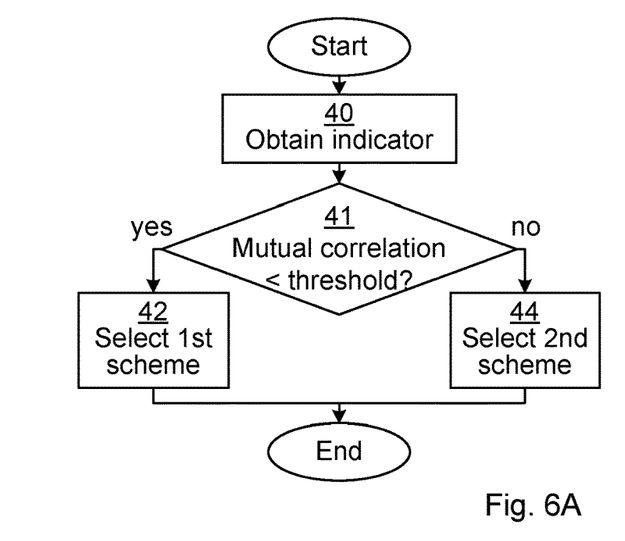
FIGS. 6A-B are flow charts illustrating methods for determining how to prepare transmission signals for transmission in the transmitter device of FIG. 4.
Figure 6B:
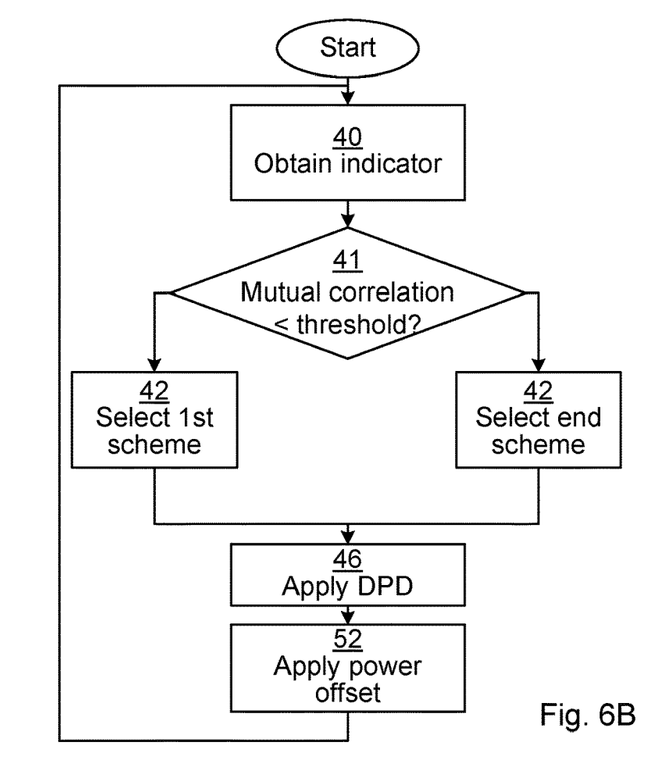

FIGS. 6A-B are flow charts illustrating methods for determining how to prepare transmission signals for transmission. The methods are performed in a transmitter device, e.g. the radio network node 1 or the wireless terminal 2 of FIG. 1. The methods described here are performed for preparing transmission signals per antenna branch. Hence, in a transmitter device comprising several antenna branches, the method can be performed in parallel for each antenna branch.

First, the method illustrated in FIG. 6A will be described.

In an obtain indicator step 40, an indicator of mutual correlation between signals transmitted from different transmission antennas of the transmitter device is obtained. In one embodiment, the indicator is a rank for a current transmission channel, where the rank indicating a number of independent transmission layers in spatial multiplexing. As explained above, a higher rank implies lower mutual correlation and vice versa.

In one embodiment, the indicator is a correlation metric of transmission symbols of different transmission branches of the transmitter device. For instance, the correlation metric can be obtained using the following formula:

$$C_m = \frac{1}{N} \sum_{i=1}^{N} X_i X_j^H \quad (1)$$

Where Cm denotes the correlation metric for element j, $X_i$ denotes a transmitted symbols (in vector form with size 1×N) in the i:th antenna branch of the transmission chain, $X_j$ is the transmitted symbols in the j:th branch and $^H$ denotes the Hermitian conjugate. In other words, Cm is then calculated for an antenna branch j.

In a conditional mutual correlation<threshold step 41, the indicator of mutual correlation is compared to a threshold. When the mutual correlation is less than the threshold, the method proceeds to a select 1$^{st}$ scheme step 42. Otherwise, the method proceeds to a select 2$^{nd}$ scheme step 44. If the mutual correlation is equal to the threshold, the method can proceed either way; it is not important as long as it is predictable whereby the threshold can be selected for desired effect.

In the select 1$^{st}$ scheme step 42, a first transmission signal operation scheme is selected.

In the select 2$^{nd}$ scheme step 44, a second transmission signal operation scheme is selected.

By selecting transmission signal operation scheme based on mutual correlation, the negative effects of mutual correlation can be mitigated, but only when required. In this way, more effective mitigation strategies can be selected which may have negative effects when applied to situation when mutual correlation is low.

In one embodiment, the first transmission operation scheme is a first DPD procedure and the second transmission operation scheme is a second DPD procedure. The first DPD procedure determines DPD coefficients based on mutual coupling between transmission antennas of the transmitter device. This first DPD procedure corresponds to the mutual coupling DPD described above. The second DPD procedure determines DPD coefficients without consideration to mutual coupling between transmission antennas of the transmitter device. This second DPD procedure corresponds to the conventional DPD described above.

By selecting DPD procedure based on mutual coupling, the mutual coupling DPD is only used when there is significant (as defined by the threshold) mutual coupling. In this way, the computationally heavy mutual coupling DPD is only used when beneficial; in other cases the conventional DPD is utilized which is much less demanding. This improves overall resource usage considerably and provides a more efficient transmission chain which reduces power usage.

In one embodiment, the first transmission operation scheme is a power back off for a power amplifier of the transmission device compared to the second transmission operation scheme. This implies that in the first transmission operation scheme, the transmission amplifier operates at a lower level, whereby its operation is more linear, which reduces negative effects into surrounding frequency bands. The second transmission operation scheme is then no power back off or less power back off (implying higher transmission power) compared to the first transmission operation scheme. In other words, the power of the power amplifier is backed off when there is mutual coupling is large, to thereby reduce negative effects between transmissions.

It is to be noted that a transmission operation scheme can also comprise both a DPD procedure and a power back off.

Looking now to FIG. 6B, only new or modified steps compared to the method illustrated by the flow chart of FIG. 6A will be described.

In an optional apply DPD step 46, which is only performed when the transmission signal operation schemes are DPD schemes, the determined DPD is applied in accordance with the selected DPD procedure, i.e. in accordance with either step 42 or step 44.

In an apply power back off step 52, which is only performed when the transmission signal operation schemes comprise are power back off aspects, the selected power back off is applied in the power amplifier, i.e. the power back off of step 42 and optionally of step 44.

The method can then be repeated at a suitable interval. In one embodiment, this interval is each sub-frame. In one embodiment, this interval is each transmission symbol.

Figure 7:
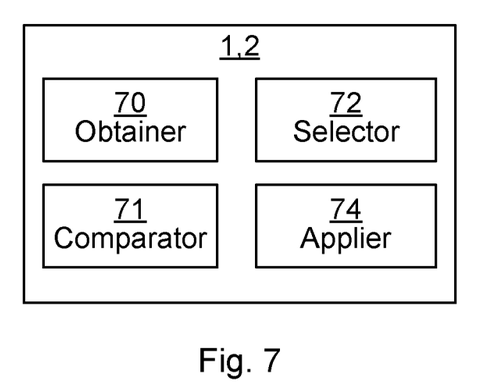
FIG. 7 is a schematic diagram showing functional modules of the transmitter device, i.e. either the radio network node or the wireless terminal, of FIG. 4 according to one embodiment.

FIG. 7 is a schematic diagram showing functional modules of the transmitter device of FIG. 4, i.e. either the radio network node 1 or the wireless terminal 2 of FIG. 1 according to one embodiment. The modules are implemented using software instructions such as a computer program executing in the transmitter device. The modules correspond to the steps in the methods illustrated in FIGS. 6A-B.

An obtainer 70 is configured to obtain an indicator of mutual correlation between transmission antennas of the transmitter device. This module corresponds to the obtain indicator step 40 of FIGS. 6A-B.

A comparator 71 is configured to compare the indicator of mutual correlation with a threshold value. This module corresponds to the conditional mutual correlation<threshold step 41 of FIGS. 6A-B.

A selector 72 is configured to select a first transmission signal operation scheme and a second transmission signal operation scheme. This module corresponds to the select 1$^{st}$ scheme step 42 and select 2$^{nd}$ scheme 44 of FIGS. 6A-B.

An applier 74 is configured to apply DPD in accordance with the selected DPD procedure. The applier 74 can also be configured to apply the selected power back off in the power amplifier. This module corresponds to the apply DPD step 46 and the apply power back off step 52 of FIG. 6B.

Figure 8:
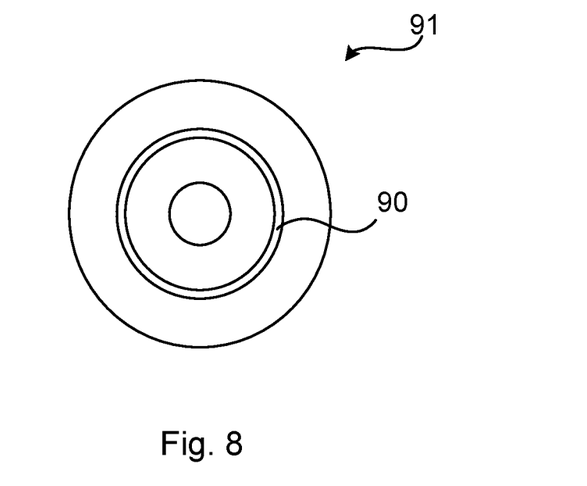
FIG. 8 shows one example of a computer program product comprising computer readable means.

FIG. 8 shows one example of a computer program product comprising computer readable means. On this computer readable means a computer program 91 can be stored, which computer program can cause a processor to execute a method according to embodiments described herein. In this example, the computer program product is an optical disc, such as a CD (compact disc) or a DVD (digital versatile disc) or a Blu-Ray disc. As explained above, the computer program product could also be embodied in a memory of a device, such as the computer program product 66 of FIG. 2 or the computer program product 86 of FIG. 3. While the computer program 91 is here schematically shown as a track on the depicted optical disk, the computer program can be stored in any way which is suitable for the computer program product, such as a removable solid state memory, e.g. a Universal Serial Bus (USB) drive.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A method for determining how to prepare transmission signals for transmission, the method comprising, in a transmitter device:
    obtaining an indicator of mutual correlation between signals transmitted from different transmission antennas of the transmitter device;
    in response to the indicator indicating mutual correlation less than a threshold value, selecting a first transmission signal operation scheme; and
    in response to the indicator indicating a mutual correlation greater than the threshold value, selecting a second transmission signal operation scheme; wherein
    the first transmission signal operation scheme is a first Digital PreDistortion (DPD) procedure which determines DPD coefficients based on mutual coupling between transmission antennas of the transmitter device; and
    the second transmission signal operation scheme is a second DPD procedure which determines DPD coefficients without consideration to the mutual coupling between the transmission antennas of the transmitter device.

2. The method of claim 1, further comprising applying DPD in accordance with the selected transmission signal operation scheme.

3. The method of claim 1, wherein the first transmission signal operation scheme is a power back off for a power amplifier of the transmitter device compared to the second transmission signal operation scheme.

4. The method of claim 3, further comprising applying the selected power back off in the power amplifier.

5. The method of claim 1, wherein the indicator is a rank for a current transmission channel, the rank indicating a number of independent transmission layers in spatial multiplexing.

6. The method of claim 1, wherein the indicator is a correlation metric of transmission symbols of different transmission branches of the transmitter device.

7. The method of claim 1, wherein the method is repeated for each transmission symbol of the transmitter device.

8. A transmitter device for determining how to prepare transmission signals for transmission, the transmitter device comprising:
    processing circuitry; and
    memory containing instructions executable by the processing circuitry whereby the transmitter device is operative to:
        obtain an indicator of mutual correlation between signals transmitted from different transmission antennas of the transmitter device;
        in response to the indicator indicating a mutual correlation less than a threshold value, select a first transmission signal operation scheme; and
        in response to the indicator indicating a mutual correlation greater than the threshold value, select a second transmission signal operation scheme; wherein
        the first transmission signal operation scheme is a first Digital PreDistortion (DPD) procedure which determines DPD coefficients based on mutual coupling between transmission antennas of the transmitter device; and
        the second transmission signal operation scheme is a second DPD procedure which determines DPD coefficients without consideration to the mutual coupling between the transmission antennas of the transmitter device; and
    wherein the instructions are such that the transmitter device is operative to apply DPD in accordance with the selected transmission signal operation scheme.

9. The transmitter device of claim 8, wherein the first transmission signal operation scheme is a power back off for a power amplifier of the transmission device compared to the second transmission signal.

10. The transmitter device of claim 9, wherein the instructions are such that the transmitter device is operative to apply the selected power back off in the power amplifier.

11. The transmitter device of claim 8, wherein the indicator is a rank for a current transmission channel, the rank indicating a number of independent transmission layers in spatial multiplexing.

12. The transmitter device of claim 8, wherein the indicator is a correlation metric of transmission symbols of different transmission branches of the transmitter device.

13. The transmitter device of claim 8, wherein the instructions are such that the transmitter device is operative to repeat the obtaining and selecting for each transmission symbol of the transmitter device.

14. The transmitter device of claim 8, wherein the transmitter device is a radio base station.

15. The transmitter device of claim 8, wherein the transmitter device is a mobile terminal.

16. A non-transitory computer readable recording medium storing a computer program product for controlling a transmitter device to determine how to prepare transmission signals for transmission, the computer program product comprising software instructions which, when run on processing circuitry of the transmitter device, causes the transmitter device to:
    obtain an indicator of mutual correlation between signals transmitted from different transmission antennas of the transmitter device;
    in response to the indicator indicating mutual correlation less than a threshold value, select a first transmission signal operation scheme; and
    in response to the indicator indicating a mutual correlation greater than the threshold value, select a second transmission signal operation scheme; wherein
    the first transmission signal operation scheme is a first Digital PreDistortion (DPD) procedure which determines DPD coefficients based on mutual coupling between transmission antennas of the transmitter device; and the second transmission signal operation scheme is a second DPD procedure which determines DPD coefficients without consideration to the mutual coupling between the transmission antennas of the transmitter device; and wherein the instructions are such that the transmitter device is operative to apply DPD in accordance with the selected transmission signal operation scheme.

\* \* \* \* \*